(12) United States Patent
Niikura

(10) Patent No.: US 11,811,405 B2
(45) Date of Patent: Nov. 7, 2023

(54) RESONANT GATE DRIVER CIRCUIT

(71) Applicant: ROHM CO., LTD., Kyoto (JP)

(72) Inventor: Hiroki Niikura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/691,388

(22) Filed: Mar. 10, 2022

(65) Prior Publication Data

US 2022/0200581 A1 Jun. 23, 2022

Related U.S. Application Data

(63) Continuation of application No. PCT/JP2020/033571, filed on Sep. 4, 2020.

(30) Foreign Application Priority Data

Sep. 11, 2019 (JP) .................. 2019-165519

(51) Int. Cl.
*H03K 17/687* (2006.01)
*H03K 3/012* (2006.01)

(52) U.S. Cl.
CPC ......... *H03K 3/012* (2013.01); *H03K 17/6874* (2013.01)

(58) Field of Classification Search
CPC ............... H03K 3/012; H03K 17/6874; H03K 17/04123; H02M 1/08; H02M 7/5387; H02M 7/538; H02M 7/5383; H02M 3/33571; H02M 3/33573; H02M 3/01
See application file for complete search history.

(56) References Cited

U.S. PATENT DOCUMENTS

2022/0407426 A1* 12/2022 Takeshita ................ H02M 3/01

FOREIGN PATENT DOCUMENTS

| JP | 2009181996 A | 8/2009 |
| JP | 2015119625 A | 6/2015 |
| JP | 2017077102 A | 4/2017 |

OTHER PUBLICATIONS

International Search Report for International Application No. PCT/JP2020/033571; dated Nov. 24, 2020.
Long, "Design and Analysis of a Fully-Integrated Resonant Gate Driver" The University of Tennessee; Trace Tennessee Research and Creative Exchange; Dec. 2016; 115 pages.
PCT International Preliminary Report on Patentability with Written Opinion of International Searching Authority for International Application No. PCT/JP2020/033571; dated Mar. 24, 2022.

* cited by examiner

*Primary Examiner* — Jung Kim
(74) *Attorney, Agent, or Firm* — CANTOR COLBURN LLP

(57) ABSTRACT

A resonant gate driver 200A includes an H-bridge circuit and a resonant inductor integrated on a semiconductor substrate. A first leg of the H-bridge circuit includes a first high-side transistor, a first output node, and a first low-side transistor such that they are arranged side-by-side in a first direction (x direction) in a first region defined along a first side. The second leg of the H-bridge circuit includes a second high-side transistor, a second output node, and a second low-side transistor such that they are arranged side-by-side in a first direction (x direction) in a second region defined along a second side. A resonant inductor is a parasitic inductance that occurs in a coupling means that electrically couples the first output node and the second output node.

7 Claims, 7 Drawing Sheets

RESONANT GATE DRIVER CIRCUIT

CROSS REFERENCES TO RELATED APPLICATIONS

This application is a continuation under 35 U.S.C. § 120 of PCT/JP2020/033571, filed Sep. 4, 2020, which is incorporated herein by reference, and which claimed priority to Japanese Application No. 2019-165519, filed on Sep. 11, 2019. The present application likewise claims priority under 35 U.S.C. § 119 to Japanese Application No. 2019-165519, filed Sep. 11, 2019, the entire content of which is also incorporated herein by reference.

1. TECHNICAL FIELD

The present disclosure relates to a resonant gate driver circuit.

2. DESCRIPTION OF THE RELATED ART

In various kinds of applications such as DC/DC converters, power conversion apparatuses, motor driving circuits, etc., a switching circuit including a power transistor and a driving circuit (gate driver) thereof is employed.

As a driving method for a power transistor, a resonant driving method has been proposed. With such a resonant driving method using LC resonance, it is possible to switch a power transistor at a high frequency with low power consumption.

SUMMARY

In a case in which an inductance is configured as a chip component, this leads to an increased number of components, resulting in a problem of an increased cost. On the other hand, in a case in which such an inductance is integrated on a semiconductor substrate (semiconductor chip) as a spiral inductance using the monolithic microwave integrated circuit (MMIC) technique, this leads to an increased DC resistance value, resulting in degraded performance.

The present disclosure has been made in view of such a situation.

An embodiment of the present disclosure relates to a resonant gate driver circuit structured to drive a power transistor. The resonant gate driver circuit includes: an H-bridge circuit including a first leg having a first output node, a first upper arm, and a first lower arm, and a second leg having a second output node coupled to a gate of the power transistor, a second upper arm, and a second lower arm; and a resonant inductor coupled between the first output node and the second output node. The H-bridge circuit is integrated on a semiconductor substrate having a first side and a second side each extending in a first direction and a third side and a fourth side each extending in a second direction that is orthogonal to the first direction. A first high-side transistor that forms the first upper arm, the first output node, and a first low-side transistor that forms the first lower arm are arranged side-by-side in the first direction in a first region along the first side. A second high-side transistor that forms the second upper arm, the second output node, and a second low-side transistor that forms the second lower arm are arranged side-by-side in the first direction in a second region along the second side. The resonant inductor is structured as a parasitic inductance that occurs in a coupling means that electrically couples the first output node and the second output node.

The first output node and the second output node are arranged in the vicinity of two opposite sides of a rectangular semiconductor substrate so as to provide a maximum distance between them. With this, a parasitic inductance that occurs in a coupling means that couples the first output node and the second output node can be employed as the resonant inductance. This eliminates the need for an external chip component.

Also, the coupling means may be structured as wiring formed in a metal wiring layer that extends in the second direction from the first output node to the second output node.

Also, the coupling means may include a bonding wire.

Also, a first output pad that corresponds to the first output node and a second output pad that corresponds to the second output node may be formed on the semiconductor substrate. Also, the coupling means may include a bonding wire that couples the first output pad and the second output pad.

Also, a first output pad that corresponds to the first output node and a second output pad that corresponds to the second output node may be formed on the semiconductor substrate. Also the resonant gate driver circuit may further include a non-coupling pin arranged on the third side. Also, the coupling means may include a first bonding wire that couples the first output pad and the non-coupling pin and a second bonding wire that couples the second output pad and the non-coupling pin.

Also, the resonant gate driver circuit may further include: a first pre-driver structured to drive the first leg; and a second pre-driver structured to drive the second leg. Also, the first pre-driver may be arranged in a region adjacent to the first leg in the second direction. Also, the second pre-driver may be arranged in a region adjacent to the second leg on an opposite side in the second direction.

Also, the resonant gate driver circuit may further include a logic circuit structured to control the first pre-driver and the second pre-driver. Also, the logic circuit may be arranged in a region interposed between the first pre-driver and the second pre-driver.

It should be noted that any combination of the components described above or any component or any manifestation of the present disclosure may be mutually substituted between a method, apparatus, system, and so forth, which are also effective as an embodiment of the present disclosure.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
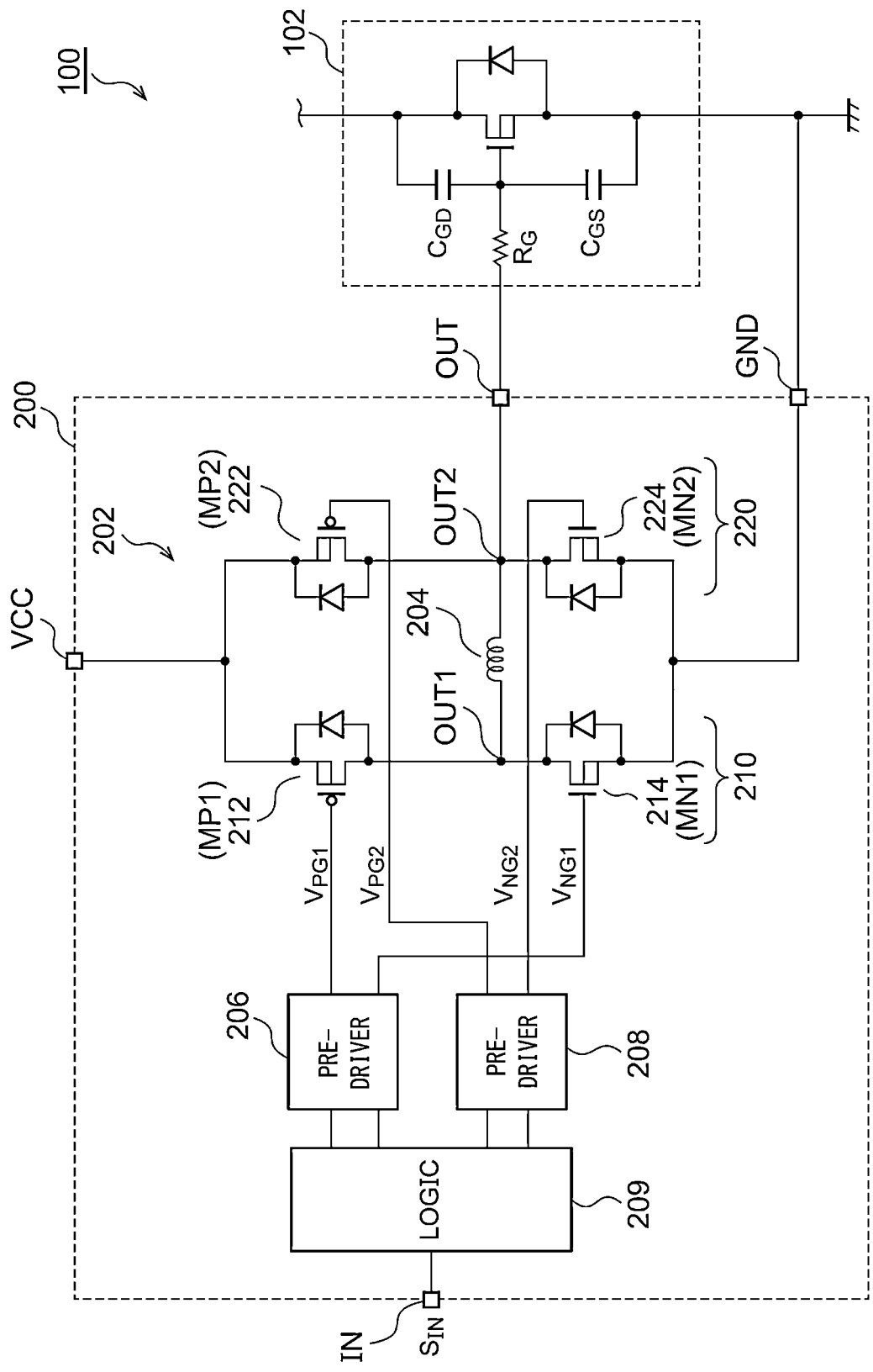
FIG. 1 is an equivalent circuit diagram of a switching circuit including a resonant gate driver circuit.

Description will be made below regarding preferred embodiments with reference to the drawings. In each drawing, the same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Embodiment 1

FIG. 1 is an equivalent circuit diagram showing a switching circuit 100 provided with a resonant gate driver circuit 200. The switching circuit 100 is provided with the resonant gate driver circuit 200 and a power transistor 102. In FIG. 1, the power transistor 102 is configured as an N-channel MOSFET. Also, the power transistor 102 may be configured as a P-channel MOSFET, Insulated Gate Bipolar Transistor (IGBT), or a bipolar transistor. Also, the material of the power transistor 102 is not restricted in particular. The power transistor 102 may be formed of a S material, GaN material, SiC material, or the like. Description will be made in the embodiment assuming that the power transistor 102 is configured as a low-side transistor arranged such that its source is grounded. It should be noted that the power transistor 102 may be configured as a high-side transistor. The power transistor 102 has a parasitic capacitance $C_{GD}$ that occurs between the gate and the drain thereof, and a parasitic capacitance $C_{GS}$ that occurs between the gate and the source. Furthermore, the power transistor 102 has a gate resistance $R_G$.

The resonant gate driver circuit 200 receives a control input $S_{IN}$ via its input pin IN and drives the power transistor 102 according to the control input $S_{IN}$. For example, when the control input $S_{IN}$ is set to the high level, the resonant gate driver circuit 200 outputs a high-level gate voltage $V_G$ via its output pin OUT. Conversely, when the control input $S_{IN}$ is set to the low level, the resonant gate driver circuit 200 outputs a low-level gate voltage $V_G$ via the output pin OUT.

The resonant gate driver circuit 200 includes an H-bridge circuit 202, a resonant inductor 204, a first pre-driver 206, a second pre-driver 208, and a logic circuit 209 such that they are housed in a single package.

The H-bridge circuit 202 includes a first leg 210 and a second leg 220. The first leg 210 includes a first output node OUT1, a first upper arm 212, and a first lower arm 214. The second leg 220 includes a second output node OUT2, a second upper arm 222, and a second lower arm 224. The second output node OUT2 is coupled to the gate of the power transistor 102 via an OUT pin.

The first upper arm 212 and the second upper arm 222 may each be configured as a PMOS transistor, which will also be denoted as a first high-side transistor MP1 and a second high-side transistor MP2, respectively. Similarly, the first lower arm 214 and the second lower arm 224 may each be configured as an NMOS transistor, which will also be denoted as a first low-side transistor MN1 and a second low-side transistor MN2.

The resonant inductor 204 is coupled between the first output node OUT1 and the second output node OUT2.

The logic circuit 209 generates a control signal that is an instruction to turn on and off each of the first upper arm 212, the first lower arm 214, the second upper arm 222, and the second lower arm 224, according to a control input SN. The first pre-driver 206 supplies a driving voltage $V_{PG1}$ to the gate of the first upper arm 212 and a driving voltage $V_{PG2}$ to the gate of the second upper arm 222 according to an output of the logic circuit 209. The second pre-driver 208 supplies a driving voltage $V_{NG1}$ to the gate of the first lower arm 214 and a driving voltage $V_{NG2}$ to the gate of the second lower arm 224 according to the output of the logic circuit 209.

The resonant inductor 204 forms an LCR resonant circuit together with parasitic capacitances $C_{GD}$ and $C_{GS}$ and a parasitic resistance $R_G$ of the power transistor 102. The resonant gate driver circuit 200 switches on and off the power transistor 102 at high speed using the LCR resonant circuit.

Figure 2:
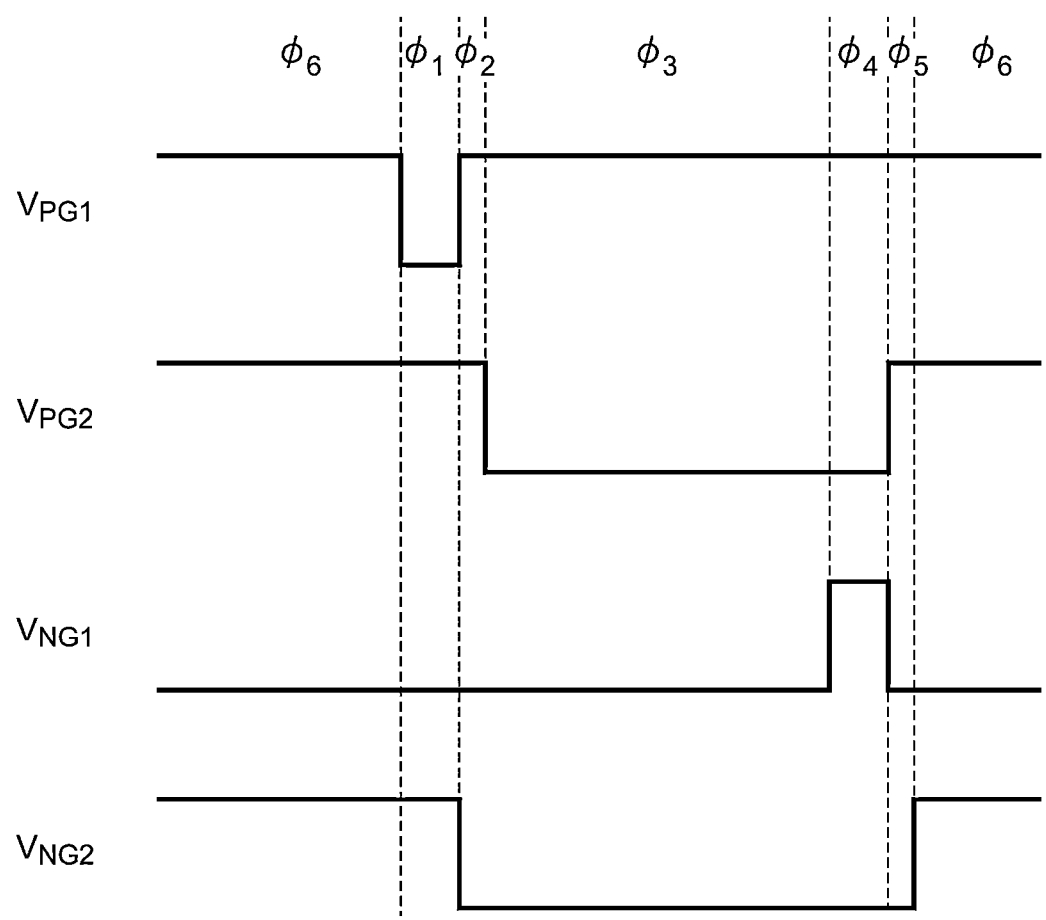
FIG. 2 is a waveform diagram showing an example of the operation of the resonant gate driver circuit shown in FIG. 2.

FIG. 2 is a waveform diagram showing an example of the operation of the resonant gate driver circuit 200 shown in FIG. 1. The resonant gate driver circuit 200 is switchable to the following six states $\phi_1$ through $\phi_6$.

$\phi_1$: MP1=ON, MP2=OFF, MN1=OFF, MN2=ON
$\phi_2$: MP1=OFF, MP2=OFF, MN1=OFF, MN2=OFF
$\phi_3$: MP1=OFF, MP2=ON, MN1=OFF, MN2=OFF
$\phi_4$: MP1=OFF, MP2=ON, MN1=ON, MN2=OFF
$\phi_5$: MP1=OFF, MP2=OFF, MN1=OFF, MN2=ON Next, description will be made regarding a specific configuration of the resonant gate driver circuit 200 based on several examples.

Example 1

Figure 3:
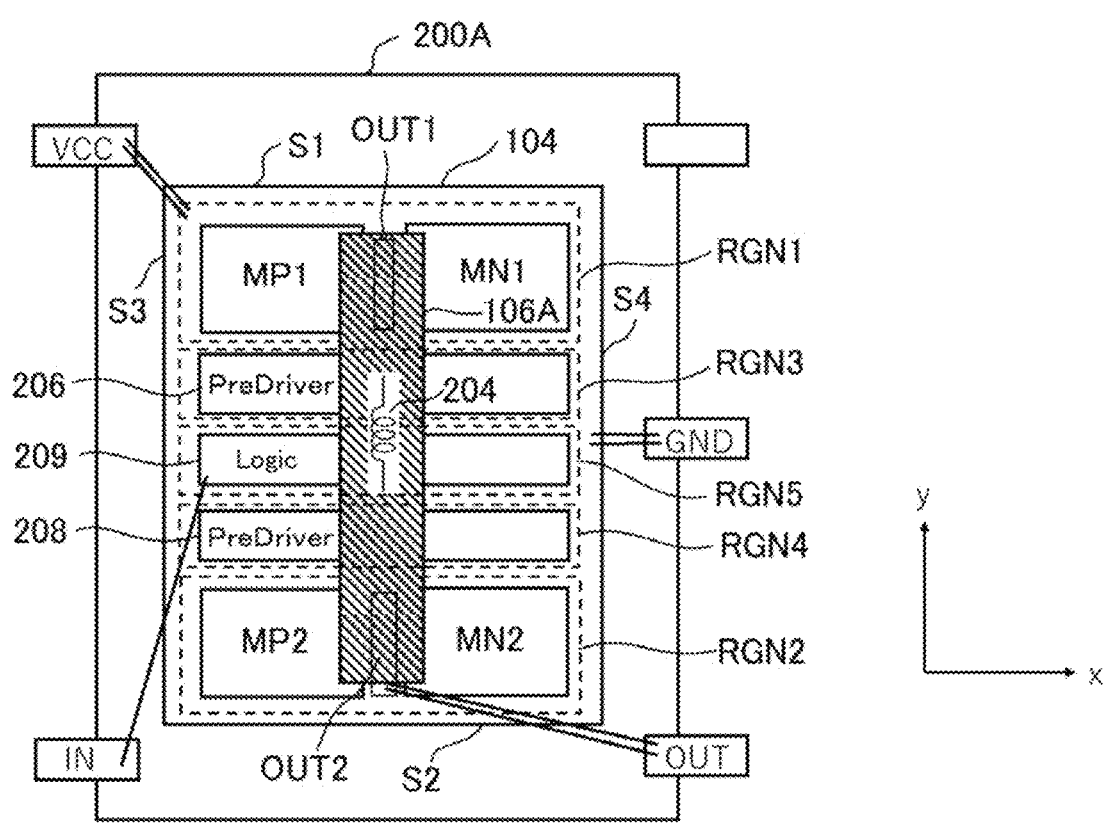
FIG. 3 is a layout diagram showing a resonant gate driver circuit according to an example 1.

FIG. 3 is a layout diagram showing a resonant gate driver circuit 200A according to an example 1. An H-bridge circuit 202, a first pre-driver 206, a second pre-driver 208, and a logic circuit 209 are integrated on a semiconductor substrate 104. The semiconductor substrate 104 has a first side S1 through a fourth side S4. The first side S1 and the second side S2 are formed such that they extend in a first direction (x-axis direction in the drawing). The third side S3 and the fourth side S4 are formed such that they extend in a second direction (y-axis direction in the drawing).

In this example, the first side S1 and the second side S2 are each configured as a short side. The third side S3 and the fourth side S4 are each configured as a long side.

The first high-side transistor MP1 that forms the first upper arm 212, the first output node OUT1, and the first low-side transistor MN1 that forms a first lower arm 214 are arranged side-by-side in the x-axis direction in a first region RGN1 defined along the first side S1.

The second high-side transistor MP2 that forms the second upper arm 222, the second output node OUT2, and the second low-side transistor MN2 that forms a second lower arm 224 are arranged side-by-side in the x-axis direction in a second region RGN2 defined along the second side S2.

The resonant inductor 204 is configured as a parasitic inductance that occurs in a coupling means 106A electrically coupling the first output node OUT1 and the second output node OUT2. In the example 1, the coupling means is configured as wiring formed in the form of a metal wiring layer that extends in the y direction from the first output node OUT1 to the second output node OUT2. For example, the metal wiring layer may be configured as a top metal layer.

The first pre-driver 206 is formed in a third region RGN3 adjacent to the first region RGN1. The second pre-driver 208 is formed in a fourth region RGN4 adjacent to the second region RGN2. The logic circuit 209 is formed in a fifth region RGN5 interposed between the third region RGN3 and the fourth region RGN4.

The above is the layout of the resonant gate driver circuit 200. In the resonant gate driver circuit 200, the first output node OUT1 and the second output node OUT2 are respectively arranged in regions in the vicinity of the two sides S1 and S2 that are opposite to each other on the rectangular semiconductor substrate 104 such that they are arranged at a maximum distance between them. With this, a parasitic inductance that occurs in the coupling means 106A that couples the first output node OUT1 and the second output node OUT2 can be used as the resonant inductor 204. Such an arrangement requires no external chip component. Furthermore, this allows the wiring line to be configured with a larger width as compared with a case in which the resonant inductor 204 is configured as a spiral inductor. This allows the resonant inductor 204 to have a smaller DC resistance value, thereby providing the resonant gate driver circuit with improved performance.

Example 2

Figure 4:
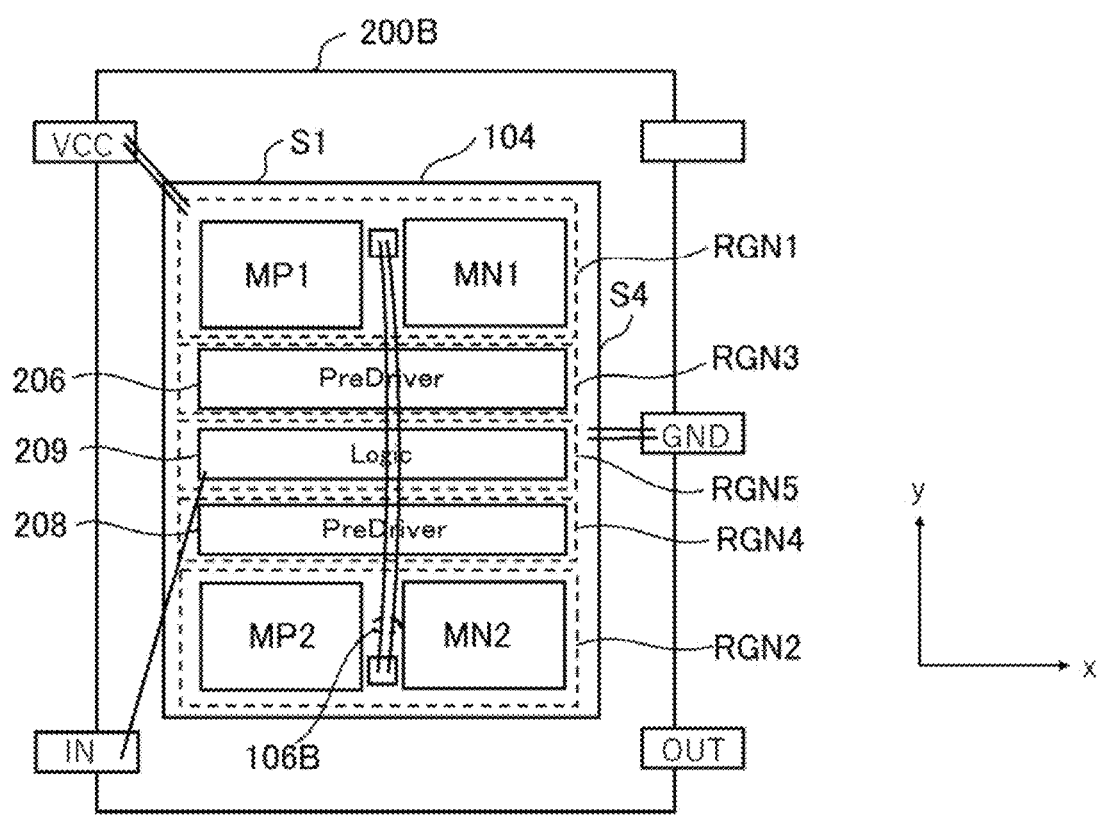
FIG. 4 is a layout diagram showing a resonant gate driver circuit according to an example 2.

FIG. 4 is a layout diagram showing a resonant gate driver circuit 200B according to an example 2. In the example 2, as with the example 1, a parasitic inductance that occurs in a coupling means 106B that electrically couples the first output node OUT1 and the second output node OUT2 is used as the resonant inductor 204. In the second example, the coupling means 106B is configured as a bonding wire.

In the first region RGN1, a pad that corresponds to the first output node OUT1 is formed between the first high-side transistor MP1 and the first low-side transistor MN1. Furthermore, in the second region RGN2, a pad that corresponds to the second output node OUT2 is formed between the second high-side transistor MP2 and the second low-side transistor MN2. In the example 2, one or multiple bonding wires are provided between the OUT1 pad and the OUT2 pad so as to couple them. With this, a parasitic inductance that occurs in the bonding wire is used as the resonant inductor 204.

Example 3

Figure 5:
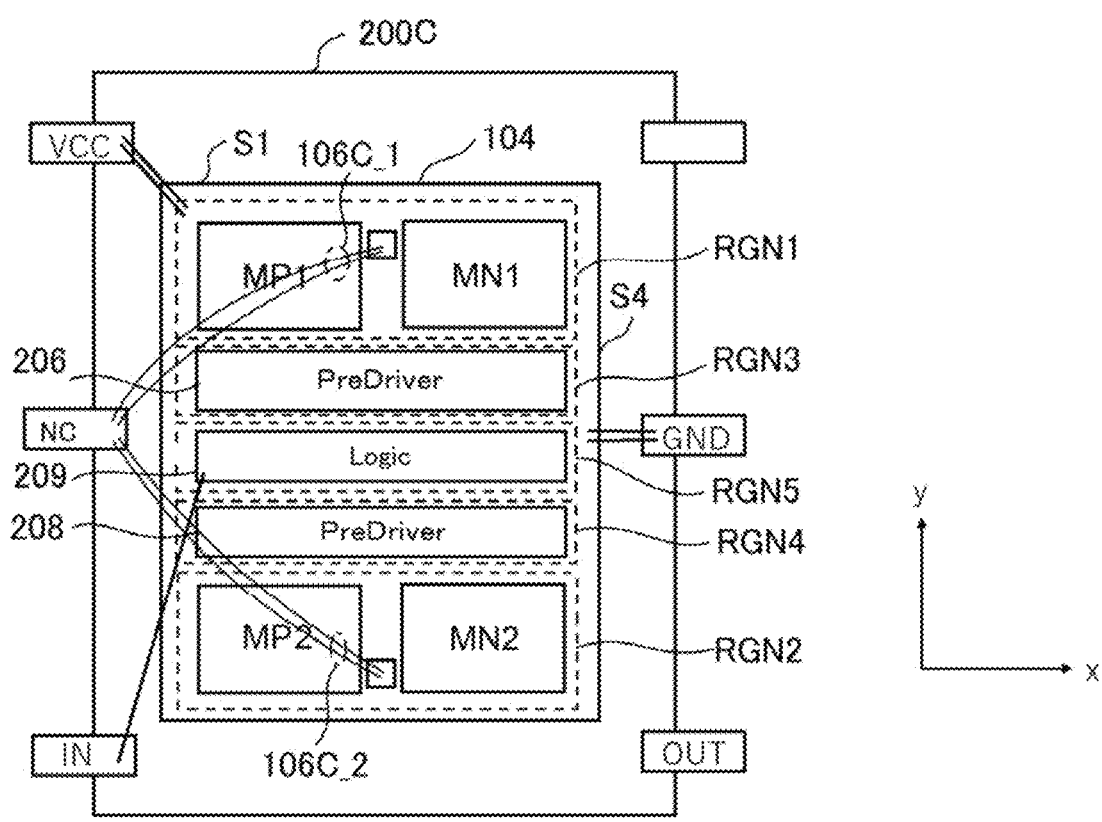
FIG. 5 is a layout diagram showing a resonant gate driver circuit according to an example 3.

FIG. 5 is a layout diagram showing a resonant gate driver circuit 200C according to an example 3. In the example 3, as with the example 2, a bonding wire is used as a coupling means 106C.

As with the example 2, a pad that corresponds to the first output node OUT1 is formed between the first high-side transistor MP1 and the first low-side transistor MN1 in the first region RGN1. Furthermore, a pad that corresponds to the second output node OUT2 is formed between the second high-side transistor MP2 and the second low-side transistor MN2 in the second region RGN2. Moreover, the resonant gate driver circuit 200C is further provided with a non-coupling pin NC arranged in the vicinity of the center of the third side S3.

The coupling means 106C includes a first bonding wire 106C_1 and a second bonding wire 106C_2. In the resonant gate driver circuit 200, the non-coupling pin is provided on the third side S3. The first bonding wire 106C_1 couples the first output pad OUT1 and the non-coupling pin NC. The second bonding wire 106C_2 couples the second output pad OUT2 and the non-coupling pin NC.

With such an arrangement in which the first output pad OUT1 and the second output pad OUT2 are coupled via the non-coupling pin NC, this allows the parasitic inductance to be increased as compared with the example 2.

Embodiment 2

Figure 6:
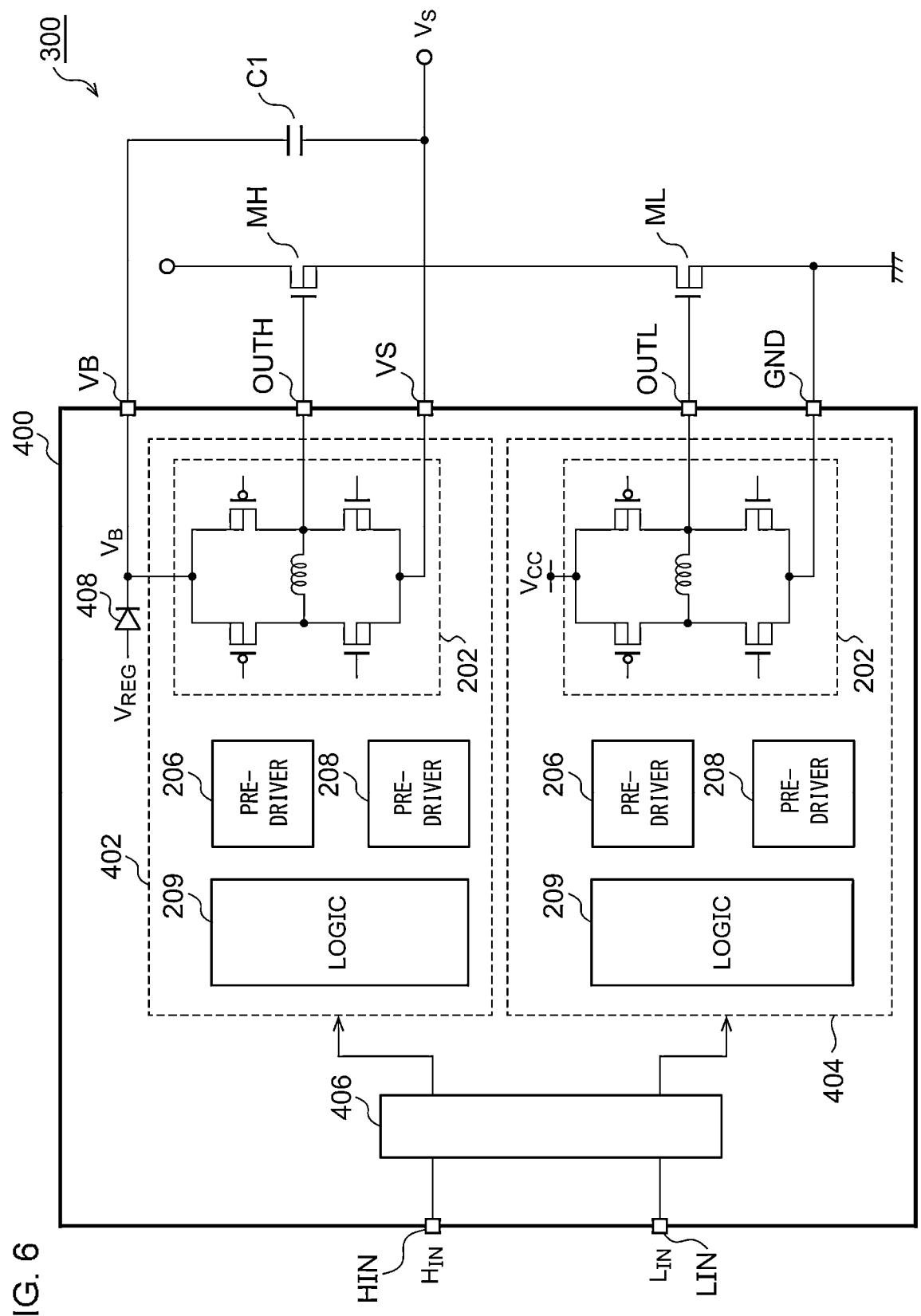
FIG. 6 is a circuit diagram showing a switching circuit according to an embodiment 2.

FIG. 6 is a circuit diagram showing a switching circuit 300 according to an example 2. The switching circuit 300 is configured as a half-bridge circuit or a single-phase inverter. The switching circuit 300 is provided with a high-side transistor MH, a low-side transistor ML, a bootstrap capacitor C1, and a resonant gate driver circuit 400.

The resonant gate driver circuit 400 is provided with a high-side driver 402, a low-side driver 404, a common logic 406, and a rectifier element 408. The input pins LIN and HIN receive a low-side control input SL and a high-side control input SH, respectively. The high-side driver 402 drives the high-side transistor MH based on the control input SH. The low-side driver 404 drives the low-side transistor ML based on the control input SL.

A constant voltage VREG is applied to the bootstrap capacitor C1 via the rectifier element 408. This generates a high-side voltage $V_B$ at a high-side pin (high-side line) VB such that it is higher than the voltage $V_S$ that occurs at a switching terminal (switching line) VS.

The high-side driver 402 and the low-side driver 404 each have the same configuration as that of the resonant gate driver circuit 200 described above. The above is the configuration of the resonant gate driver circuit 400.

The common logic 406 receives the control inputs (HIN signal, LIN signal) from an external circuit. The HIN signal is an instruction to turn on and off the high-side transistor MH. The LIN signal is an instruction to turn on and off the low-side transistor ML. The common logic 406 controls the high-side driver 402 according to the HIN signal, and controls the low-side driver 404 according to the LIN signal.

Figure 7:
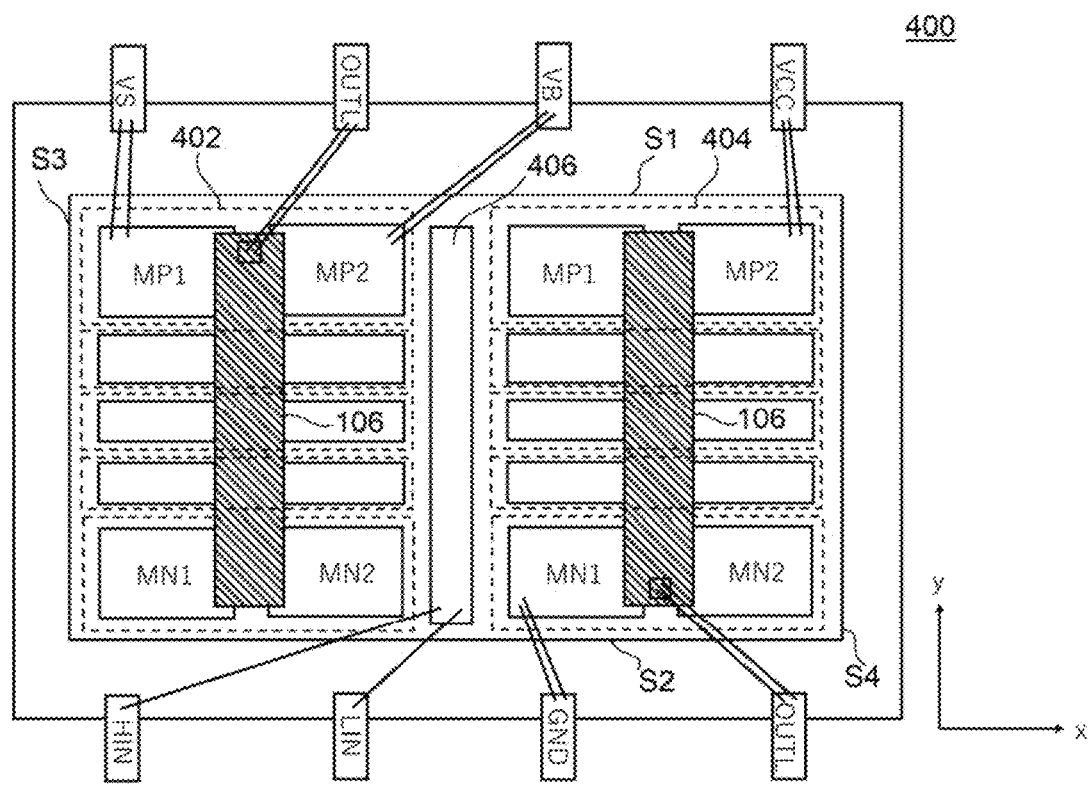
FIG. 7 is a layout diagram showing the resonant gate driver circuit shown in FIG. 6.

FIG. 7 is a layout diagram showing a resonant gate driver circuit 400 shown in FIG. 6. In the resonant gate driver circuit 400, the high-side driver 402, the common logic 406, and the low-side driver 404 are arranged in this order side-by-side in the first direction (x direction).

The high-side driver 402 and the low-side driver 404 each have the same layout as that shown in FIG. 3. The VS pin, OUTL pin, VB pin, and VCC pin are arranged along a side of a package that extends in the x direction. The HIN pin, LIN pin, GND pin, and OUTL pin are arranged along the opposite side of the package that extends in the x direction.

Description has been made with reference to FIG. 7 regarding an arrangement in which the coupling means 106 is configured as metal wiring in the same manner as shown in FIG. 3. Also, the coupling means 106 may be configured as a bonding wire as shown in FIG. 4 or FIG. 5.

Description has been made regarding the present invention with reference to the embodiments using specific terms. However, the above-described embodiments show only an aspect of the mechanisms and applications of the present invention. Rather, various modifications and various changes in the layout can be made without departing from the spirit and scope of the present invention defined in appended claims.

What is claimed is:

1. A resonant gate driver circuit structured to drive a power transistor, comprising:
   an H-bridge circuit comprising a first leg having a first output node, a first upper arm, and a first lower arm, and a second leg having a second output node coupled to a gate of the power transistor, a second upper arm, and a second lower arm; and
   a resonant inductor coupled between the first output node and the second output node,
   wherein the H-bridge circuit is integrated on a semiconductor substrate having a first side and a second side each extending in a first direction and a third side and a fourth side each extending in a second direction that is orthogonal to the first direction,
   wherein a first high-side transistor that forms the first upper arm, the first output node, and a first low-side transistor that forms the first lower arm are arranged side-by-side in the first direction in a first region along the first side,
   wherein a second high-side transistor that forms the second upper arm, the second output node, and a second low-side transistor that forms the second lower arm are arranged side-by-side in the first direction in a second region along the second side,
   and wherein the resonant inductor is structured as a parasitic inductance that occurs in a coupling means that electrically couples the first output node and the second output node.

2. The resonant gate driver circuit according to claim 1, wherein the coupling means is structured as wiring formed in a metal wiring layer that extends in the second direction from the first output node to the second output node.

3. The resonant gate driver according to claim 1, wherein the coupling means comprises a bonding wire.

4. The resonant gate driver circuit according to claim 1, wherein a first output pad that corresponds to the first output node and a second output pad that corresponds to the second output node are formed on the semiconductor substrate,
   and wherein the coupling means comprises a bonding wire that couples the first output pad and the second output pad.

5. The resonant gate driver circuit according to claim 1, wherein a first output pad that corresponds to the first output node and a second output pad that corresponds to the second output node are formed on the semiconductor substrate,
   wherein the resonant gate driver circuit further comprises a non-coupling pin arranged on the third side,
   and wherein the coupling means comprises a first bonding wire that couples the first output pad and the non-coupling pin and a second bonding wire that couples the second output pad and the non-coupling pin.

6. The resonant gate driver circuit according to claim 1, further comprising:
   a first pre-driver structured to drive the first leg; and
   a second pre-driver structured to drive the second leg,
   wherein the first pre-driver is arranged in a region adjacent to the first leg in the second direction,
   and wherein the second pre-driver is arranged in a region adjacent to the second leg on an opposite side in the second direction.

7. The resonant gate driver circuit according to claim 6, further comprising a logic circuit structured to control the first pre-driver and the second pre-driver,
   and wherein the logic circuit is arranged in a region interposed between the first pre-driver and the second pre-driver.

* * * * *